United States Patent [19]
McArthur

[11] Patent Number: 5,105,875
[45] Date of Patent: Apr. 21, 1992

[54] COOLING SYSTEM FOR AUXILIARY POWER UNIT

[75] Inventor: Malcolm J. McArthur, Escondido, Calif.

[73] Assignee: Sundstrand Corporation, Rockford, Ill.

[21] Appl. No.: 639,292

[22] Filed: Jan. 10, 1991

[51] Int. Cl.$^5$ .............................................. F28D 21/00
[52] U.S. Cl. .......................................... 165/1; 165/41; 165/80.4; 60/39.83; 123/41.31
[58] Field of Search ................... 165/41, 80.4, 1; 62/7; 361/385; 60/39.83, 736, 39.08; 123/41.31

[56] References Cited

U.S. PATENT DOCUMENTS

| | | | |
|---|---|---|---|
| 3,071,185 | 1/1963 | Simmons | 165/22 |
| 3,300,965 | 1/1967 | Sherlaw et al. | 60/39.08 |
| 3,623,546 | 11/1971 | Banthin et al. | 165/51 |
| 4,080,783 | 3/1978 | Hamburg et al. | 60/39.08 |
| 4,104,873 | 8/1978 | Coffinberry | 60/39.83 X |
| 4,474,001 | 10/1984 | Griffin et al. | 60/204 |
| 4,513,346 | 4/1985 | Devins | 361/212 |
| 4,763,611 | 8/1988 | Kobayashi et al. | 123/41.31 |
| 4,773,212 | 9/1988 | Griffin et al. | 60/39.02 |
| 4,893,590 | 1/1990 | Kashimura et al. | 123/41.31 |

FOREIGN PATENT DOCUMENTS

| | | | |
|---|---|---|---|
| 60-1370 | 1/1985 | Japan | 123/41.31 |
| 368970 | 6/1963 | Switzerland | 123/41.31 |

Primary Examiner—Allen J. Flanigan
Attorney, Agent, or Firm—Antonelli, Terry, Stout & Kraus

[57] ABSTRACT

A cooling system which utilizes a lubricant for lubricating moving components within the system and a combustible fuel which is to be combusted within the system includes a first circuit (19) which contains at least one circuit element and which operates within a first range of temperatures, a second circuit (21) which contains at least one circuit element and which operates within a second range of temperatures which is lower than the first range of temperatures at which the first circuit operates, a lubricant flow path (25) located adjacent the first circuit for cooling the first circuit by providing a heat flow path between the lubricant and the first circuit when the lubricant is disposed within the lubricant flow path, and a combustible fuel flow path (23) located adjacent the second circuit for cooling the second circuit by providing a heat flow path between the combustible fuel and the second circuit when the combustible fuel is disposed within the combustible fuel flow path. A method associated with the cooling system involves the steps of providing a heat flow path between the first circuit and the lubricant in order to cool the first circuit, and providing a heat flow path between the second circuit and the combustible fuel in order to cool the second circuit.

10 Claims, 1 Drawing Sheet

COOLING SYSTEM FOR AUXILIARY POWER UNIT

TECHNICAL FIELD

The present invention relates to cooling systems which are utilized by auxiliary power units (APUs) disposed within airframes. More particularly, the present invention relates to the use of both combustible fuel and lubricating oil for cooling electronic devices utilized by such units.

BACKGROUND ART

APUs are well known and commonly used in aircraft for the purpose of generating power to be used by various elements within the aircraft. For example, APUs can be utilized to provide power to a refrigerant compressor in the aircraft via a generator so that cabin air cooling can be provided when the main engine system of the aircraft is not running. Likewise, APUs can be used to provide power to various electrical systems of the aircraft via a generator in order to ensure that devices such as air-circulating fans and cabins lights can be activated when the main engine system is not operating.

A typical APU contains a combustor which receives compressed air from an air compressor and fuel from a fuel supply source in order to generate a high pressure combustion product (such as a hot gas) for driving a turbine, and a gearbox or transmission for transferring power from the shaft of the turbine to a generator. Associated with the APU are a variety of electronic devices for performing functions such as power control and switching. Fuel is supplied to the combustor for combustion therein, and lubricating oil is supplied to elements disposed within or associated with the APU that have moving parts (such as the gearbox and/or the generator) for lubrication and cooling purposes.

As is the case with many well known electronic devices and components, electronic devices associated with an APU must be cooled to maintain the electronic devices at a temperature within a range in which they can safely operate, i.e., in which they can operate without risk of damage or malfunction. Common methods of cooling electronic devices associated with an APU include oil (conductive and sprayed) cooling and air cooling. Furthermore, as exemplified by U.S. Pat. No. 3,623,564, the use of engine fuel in the cooling of electronic equipment mounted on a gas turbine engine is also known. Additionally, U.S. Pat. No. 3,071,185 discloses that the temperature of a fuel circulating in a temperature control system for aircraft equipment can be lowered by passing the circulating fuel through a fuel input heat exchanger and can be raised by passing the circulating fluid through a hydraulic oil input heat exchanger.

While the above-mentioned methods are useful for controlling the temperature of a variety of different elements, such methods are considered to be less than satisfactory for cooling APU electronic devices which have different temperature ranges within which they can operate. For example, in a fuel-driven oil-lubricated APU system utilizing high power electronic devices which can safely operate at temperatures up to 250° F. and low power electronic devices which can only safely operates at temperatures up to 200° F., neither the fuel-based cooling method nor the cooling method utilizing oil or air can be satisfactorily utilized. If the fuel is used to cool both the high and low power electronic devices, the heat exchange between the fuel and the high power electronic devices, because such devices generally dissipate large amounts of heat, may cause the fuel to be raised to an unsatisfactory temperature level at which vapor lock or other undesirable phenomena can occur. On the other hand, if either oil or air is used to cool both the high and low power electronic devices, the size, weight, and cost of the APU system is increased, along with the amount of energy required by the APU system, due to the nature of the equipment required to maintain such coolants at an acceptable temperature. For example, if the oil which lubricates the gearbox and/or the generator is used for cooling both the high and low power electronic devices, an oil cooler which can cool the oil to a low temperature suitable for cooling the high power electronic devices must be utilized. As a result, due to the requirement that the oil cooler be able to cool the oil to temperatures lower than those suitable for cooling the low power electronic devices, a larger, heavier and more expensive oil cooler which utilizes a greater amount of energy is required, thereby increasing the amount of energy utilized by the APU system and the size, weight and cost thereof.

DISCLOSURE OF INVENTION

The present invention provides a cooling system for cooling high and low power electronic devices associated with an APU disposed in an airframe by using a lubricant (e.g., oil) which lubricates moving components within the system and a combustible fuel to be combusted in the system. The lubricant is used to cool the high power electronic devices, which dissipate large amounts of heat and operate at higher temperatures than the low power electronic devices, while the combustible fuel is used to cool the low power electronic devices, which generally dissipate smaller amounts of heat than the high power electronic devices.

A method of cooling circuit elements in a system utilizing a lubricant for lubricating moving components within the system and a combustible fuel which is to be combusted by the system in accordance with the present invention comprises the steps of providing a heat flow path between a first circuit containing at least one circuit element and the lubricant in order to cool the first circuit, the first circuit operating within a first range of temperatures, and providing a heat flow path between a second circuit containing at least one circuit element and the combustible fuel in order to cool the second circuit, the second circuit operating within a second range of temperatures which is lower than the first range of temperatures at which the first circuit operates.

A cooling system in accordance with the present invention utilizes a lubricant for lubricating moving components within the system and a combustible fuel to be combusted within the system and comprises a first circuit which contains at least one circuit element and which operates within a first range of temperatures, a second circuit which contains at least one circuit element and which operates within a second range of temperatures which is lower than the first range of temperatures at which the first circuit operates, a lubricant flow path located adjacent to the first circuit for cooling the first circuit by providing a heat flow path between the lubricant and the first circuit when the lubricant is disposed within the lubricant flow path, and a combustible fuel flow path located adjacent the second circuit for cooling the second circuit by providing a heat flow path between the combustible fuel and the second circuit when the combustible fuel is disposed within the combustible fuel flow path.

An auxiliary power unit system for use in an airframe in accordance with the present invention comprises a first circuit which contains at least one circuit element and which operates within a first range of temperatures, a second circuit which contains at least one circuit element and which operates within a second range of temperatures which is lower than the first range of temperatures at which the first circuit operates, a lubricant flow path located adjacent the first circuit for cooling the first circuit by providing a heat flow path between the lubricant and the first circuit when the lubricant is disposed within the lubricant flow path, a combustible fuel flow path located adjacent the second circuit for cooling the second circuit by providing a heat flow path between the combustible fuel and the second circuit when the combustible fuel is disposed within the combustible fuel flow path, a lubricant pump for circulating the lubricant in the lubricant flow path, a lubricant cooler for cooling the lubricant to a temperature suitable for cooling the first circuit to within the first range of temperatures, a fuel reservoir for storing the combustible fuel, a fuel pump for circulating the combustible fuel in the combustible fuel flow path, a fuel combustor coupled to receive the combustible fuel and compressed air from an air compressor for combusting the combustible fuel in order to produce a combustion product, a fuel controller for controlling the flow of the combustible fuel to the fuel combustor, a turbine which is driven by the combustion product produced by the fuel combustor, a gearbox coupled to the turbine for transferring a driving force from the turbine to at least one output device, the combustible fuel flow path running consecutively from the fuel reservoir, to a position located adjacent the second circuit, through the fuel controller, into the fuel combustor, the combustible fuel flow path providing the heat flow path between the combustible fuel and the second circuit when the combustible fuel flows through the combustible fuel flow path, and the lubricant flow path being a closed path running consecutively from the lubricant pump, through the lubricant cooler, to a position located adjacent the first circuit, through the gearbox and back to the lubricant pump, the lubricant flow path providing the heat flow path between the lubricant and the first circuit when the lubricant flows through the lubricant flow path.

The advantages associated with the present invention include a reduction in the weight, size and costs of the cooling system and a decrease in the amount of energy required by such system (since an oil cooler capable of cooling the oil to temperatures lower than those suitable for cooling the low power electronic devices is not required), and the avoidance of undesirable phenomena such as vapor lock (due to the use of lubricating oil rather than combustible fuel for cooling the high power electronic devices) which can occur when the temperature of the combustible fuel is increased to an unacceptable level. Additionally, since the high and the low electronic devices are cooled with elements which normally exist within the APU (i.e., the lubricating oil and the combustible fuel), the design of the cooling system for the APU system is simplified.

BEST MODE FOR CARRYING OUT THE INVENTION

Figure 1:
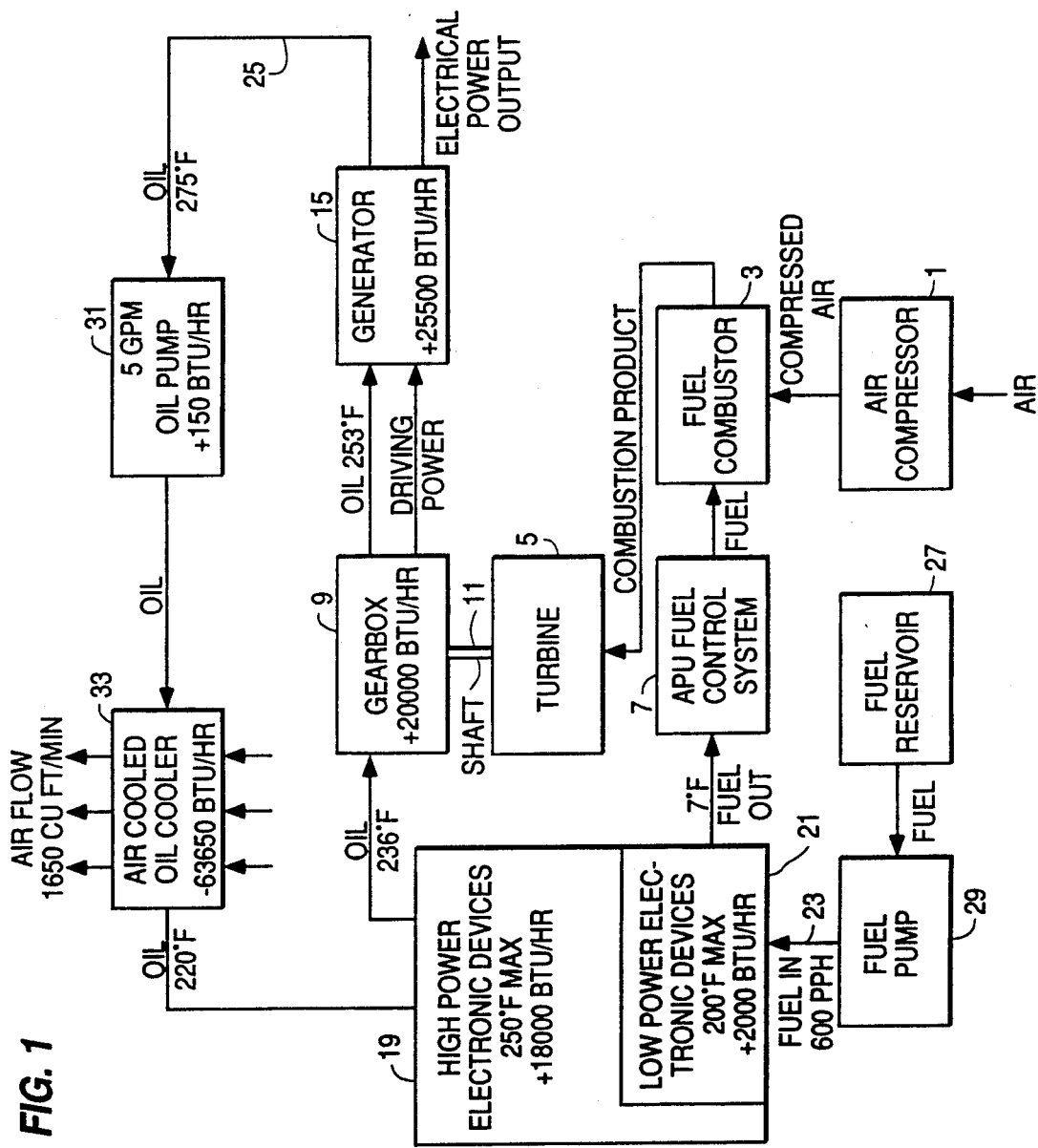
FIG. 1 is a block diagram of an APU system disposed within an airframe in accordance with the present invention.

FIG. 1 illustrates a block diagram of an APU system in accordance with the present invention. The APU system is disposed within the airframe of an aircraft and performs the function of generating electric energy or power to be used by the electrical systems of the aircraft (e.g., the cabin ventilation and lighting systems, the refrigerant system, including a refrigerant compressor for providing cooling to the cabin air, etc.). The APU can perform such functions when the main engine system of the aircraft is not being operated.

The APU system of FIG. 1 contains an APU which includes air compressor 1, fuel combustor 3, and turbine 5. Air compressor 1 compresses or pressurizes air supplied to the air compressor through the air intake (not shown) of the air compressor. Fuel combustor 5 receives both a supply of combustible fuel from fuel control system 7 and a supply of pressurized air provided by air compressor 1 and combusts the received combustible fuel in order to produce a combustion product (such as hot gas).

The combustion product produced by the fuel combustor 3 is used to drive a turbine 5, which provides a driving force or torque to gearbox or transmission 9 via shaft 11.

Gearbox 9 enables the torque to be used in the driving of accessories or output devices such as fuel pump 29, oil pump 31 and generator 15. Generator 15 is used to power various electrical systems in the aircraft and can be a variable or switched reluctance (SR) generator, a variable speed constant frequency (VSCF) generator, or any type of generator capable of providing power to such electrical systems. In the case where the main engine system of the aircraft is not operating (e.g., during passenger loading), generator 15 can be used to provide electrical energy to the aircraft electrical systems.

The APU system shown in FIG. 1 includes a set of high power electronic devices 19 and a set of low power electronic devices 21 which require cooling. It should be noted that the terms "high power" and "low power", as employed throughout the disclosure, are used to express the relative amount of power consumed and heat generated by the electronic devices 19 and 21.

Electronic devices 19 and 21 are used to perform functions such as switching, power control and the like. For example, the high power electronic devices 19 could be inverter power switches used for switching current utilized in VSCF power switching systems, or power switches for controlling current flow in the windings of a variable reluctance motor or generator, and the lower power electronic devices 21 could be digital or integrated circuit (IC) controls for such devices (e.g., for controlling a VSCF power switching system), although electronic devices 19 and 21 should not be considered to be limited to such embodiments. Each of electronic devices 19 and 21 can be thought of as a circuit (i.e., a device for performing an electrical or electronic function) containing one or more circuit elements.

As with most electronic devices, both the high power electronic devices 19 and the low power electronic devices 21 can only operate safely (i.e., without risk of malfunction or damage) within certain temperature ranges. For example, as illustrated in FIG. 1, the high power electronic devices 19 can operate safely at temperatures up to 250° F., while the low power electronic devices 21 can only operate safely at temperatures up to 200° F. Accordingly, the high power electronic devices 19 are considered to be less sensitive to temperature conditions, while the low power electronic devices 21 are considered to be more sensitive. In order for both types of electronic devices to operate safely (i.e., without risk of malfunction or damage) and efficiently, both the high power electronic devices 19 and the low power electronic devices 21 must each be maintained at a temperature falling within the safe operation temperature ranges respectively associated with such devices.

High and low power electronic devices 19 and 21, respectively, are maintained at safe operating temperatures by a cooling system associated with the APU system. The cooling system includes high power electronic devices 19, low power electronic devices 21, combustible fuel flow path 23, and lubricant or oil flow path 25. The cooling system utilizes a lubricant such as oil for cooling the high power electronic devices 19 so that such devices are prevented from overheating (i.e., from taking on a temperature falling outside of the safe operating temperature range associated therewith), and utilizes a combustible fuel for cooling low power electronic devices 21 so that such devices are also prevented from overheating.

The operation of the cooling system will now be described. Fuel is pumped from fuel reservoir 27 by fuel pump 29 in order to start the combustible fluid stored in the fuel reservoir flowing through the combustible fuel flow path 23 toward fuel combustor 3, where the combustible fuel is to be combusted. The combustible fuel flow path runs from fuel reservoir 27, to a position adjacent the low power electronic devices 21, through fuel control system 7 and into fuel combustor 3. By flowing the combustible fuel through a position in the combustible fuel flow path adjacent the low power electronic devices 21 (i.e., a position at which a heat exchange or heat flow path between the combustible and the low power electronic devices is established), the low power electronic devices are cooled due to the relatively low temperature of the combustible fuel as compared to the temperature of the low electronic devices. Although the cooling of the low power electronic devices 21 raises the temperature of the combustible fuel to some extent (e.g., to 7° F.), such cooling does not raise the temperature of the combustible fuel to an unacceptable level, as would happen if the combustible fuel were used to cool the high power electronic devices 21, and therefore undesirable phenomena such as vapor lock can be avoided.

The high power electronic devices 19, unlike the low power electronic devices 21, are not cooled by the combustible fuel in combustible fuel flow path 23. Instead, high power electronic devices 19 are cooled by a lubricant (e.g., oil) flowing through lubricant flow path 25 according to the following method. The lubricant is pumped by lubricant or oil pump 31 in order to flow the lubricant through lubricant flow path 25 toward air cooled lubricant or oil cooler 33. The lubricant flow path runs from lubricant pump 31, through lubricant cooler 33, to a position adjacent high power electronic devices 19, through gearbox 9 and generator 15, and back to lubricant pump 31. As can be seen in FIG. 1, the lubricant flow path is a closed path. By flowing the lubricant through a position in the lubricant flow path adjacent the high power electronic devices 19 (i.e., a position at which a heat exchange or heat flow path between the lubricant and the high power electronic devices is established), the high power electronic devices are cooled due to the relatively low temperature of the lubricant as compared to the temperature of the high power electronic devices. Although the cooling of the high power electronic devices 19 raises the temperature of the lubricant to a certain extent (e.g., from 220° F. to 236° F.), the gearbox and the generator can still be cooled and lubricated by the lubricant which has just flowed through the point of the lubricant flow path adjacent the high power electronic devices since the temperature of the such lubricant is still lower than the operating temperatures of the gearbox 9 and the generator 15. By using the lubricant to cool only the high power electronic devices 19 (in addition to gearbox 9 and generator 15) rather than to cool both the high power electronic devices and the low power electronic devices 21, lubricant cooler 33 does not necessarily have to be capable of cooling the lubricant to a temperature at which the low power electronic devices can safely operate, and therefore the cooling system is reduced in weight, size and cost and the amount of energy utilized by the cooling system is decreased.

It should be noted that the lubricant and combustible fuel flow paths should not be considered to be limited to the embodiments described herein. For example, it is possible that the lubricant flow path could extend from lubricant pump 21, through lubricant cooler 33, to a position located adjacent high power electronic devices 19, through generator 15 and then through gearbox 9, and back to lubricant pump 21.

Additionally, certain flow path elements of the present invention could be omitted with departing from the spirit and scope of such invention. For example, either gearbox 9 or generator 15 could be omitted from lubricant flow path 25.

It should also be noted that the oil and fuel cooling method of the present invention is applicable to all lubricated and fuel-driven systems (such as APU systems) wherein the fuel flow is insufficient to relieve the heat load of all of the elements which require cooling (e.g., APU systems wherein VSCF or SR motors and/or generators are used in association with power switches).

While the application of the oil and fuel cooling method to an APU system which utilizes an air breathing turbine has been described above, such method could also be utilized in an emergency power unit (EPU) system (which utilizes a stored air breathing turbine) or in an integrated power unit (IPU) system (which utilizes both an air breathing turbine like the APU system and a stored air breathing turbine like the EPU system).

Additionally, while elements 19 and 21 in FIG. 1 have each been used to designate a plurality of electronic devices, such elements could each represent a single electronic device or one or more circuit elements such as "high power" resistors.

Also, it should be noted that although the use of oil as a lubricant has been discussed, other known lubricants could be used as well.

Furthermore, although specific operating temperature ranges for the high and low power electronic devices 19 and 21 have been described, electronic devices having different operating temperature ranges than these could be utilized.

While the invention has been described in terms of its preferred embodiments, numerous modifications may be made thereto without departing from the spirit and scope of the invention as defined in the appended claims.

I claim:

1. A method of cooling circuit elements in a system utilizing a lubricant for lubricating moving components within the system and a combustible fuel which is to be combusted by the system, the method comprising the steps of:
   providing a heat flow path between a first circuit containing at least one circuit element and the lubricant for cooling the first circuit, said first circuit operating within a first range of temperatures; and
   providing a heat flow path between a second circuit containing at least one circuit element and the combustible fuel for cooling the second circuit, said second circuit operating within a second range of temperatures which is lower than the first range of temperatures at which said first circuit element operates.

2. A method of cooling circuit elements according to claim 1, wherein:
   the step of providing the heat flow path between the first circuit and the lubricant includes the step of flowing the lubricant through a lubricant flow path located adjacent the first circuit; and
   the step of providing the heat flow path between the second circuit and the combustible fuel includes the step of flowing the combustible fuel through a combustible fuel flow path located adjacent the second circuit.

3. A method of cooling circuit elements according to claim 2, the system being an auxiliary power unit system for use in an airframe and comprising a lubricant pump for circulating the lubricant in the lubricant flow path, a lubricant cooler for cooling the lubricant to a temperature suitable for cooling the first circuit to within the first range of temperatures, a fuel reservoir for storing the combustible fuel, a fuel pump for circulating the combustible fuel in the combustible fuel flow path, a fuel combustor coupled to receive the combustible fuel and compressed air from an air compressor for combusting the combustible fuel in order to produce a combustion product, a fuel controller for controlling the flow of the combustible fuel to the fuel combustor, a turbine which is driven by the combustion product produced by the fuel combustor, and a gearbox coupled to the turbine for transferring a driving force from the turbine to at least one output device, wherein:
   the step of flowing the lubricant through the lubricant flow path includes flowing the lubricant consecutively from the lubricant pump, through the lubricant cooler, to a position adjacent the first circuit, through the gearbox and back to the lubricant pump; and
   the step of flowing the combustible fuel through the combustible fuel flow path includes flowing the combustible fuel consecutively from the fuel reservoir, to a position adjacent the second circuit, through the fuel controller, and into the fuel combustor.

4. A method of cooling circuit elements according to claim 1, each of the first and second circuits comprising a plurality of circuit elements, wherein:
   the step of providing the heat flow path between the first circuit and the lubricant includes providing a heat flow path between a first set of circuit elements and the lubricant in order to cool the first set of circuit elements; and
   the step of providing the heat flow path between the second circuit and the combustible fuel includes providing a heat flow path between a second set of circuit elements and the combustible fuel in order to cool the second set of circuit elements.

5. A cooling system utilizing a lubricant for lubricating moving components within the system and a combustible fuel which is to be combusted within the system comprising:
   a first circuit which contains at least one circuit element and which operates within a first range of temperatures;
   a second circuit element which contains at least one circuit element and which operates within a second range of temperatures which is lower than the first range of temperatures at which said first circuit operates;
   a lubricant flow path located adjacent said first circuit for cooling said first circuit by providing a heat flow path between the lubricant and said first circuit when the lubricant is disposed within said lubricant flow path; and
   a combustible fuel flow path located adjacent said second circuit for cooling said second circuit by providing a heat flow between the combustible fuel and said second circuit when the combustible fuel is disposed within said combustible fuel flow path.

6. A cooling system according to claim 5, wherein:
   the combustible fuel flow path runs consecutively from a fuel reservoir for storing the combustible fuel, to a position adjacent to the second circuit, through a fuel controller and into a fuel combustor for combusting the combustible fuel in order to produce a combustion product, the fuel controller controlling the flow of the combustible fuel into the fuel combustor, and the combustible fuel flow path providing the heat flow path between the combustible fuel and the second circuit when the combustible fuel flows through the combustible fuel flow path; and
   the lubricant path is a closed path that runs consecutively from a lubricant pump for circulating the lubricant in the lubricant flow path, through a lubricant cooler for cooling the lubricant to a temperature suitable for cooling the first circuit to within the first range of temperatures, to a position adjacent the first circuit, through a gearbox coupled to a turbine driven by the combustion product produced by the fuel combustor, the gearbox transferring a driving force from the turbine to at least one output device, and back to the lubricant pump, said lubricant flow path providing the heat flow path between the lubricant and the first circuit when the lubricant flows through the lubricant flow path.

7. A cooling system according to claim 5, wherein:
   each of the first and second circuits contains a plurality of circuit elements.

8. An auxiliary power unit system for use in an airframe, said auxiliary power unit system comprising:

a first circuit which contains at least one circuit element and which operates within a first range of temperatures;

a second circuit which contains at least one circuit element and which operates within a second range of temperatures which is lower than the first range of temperatures at which said first circuit operates;

a lubricant flow path located adjacent said first circuit for cooling said first circuit by providing a heat flow path between the lubricant and said first circuit when the lubricant is disposed within said lubricant flow path; and a combustible fuel flow path located adjacent said second circuit for cooling said second circuit by providing a heat flow path between the combustible fuel and said second circuit when the combustible fuel is disposed within said combustible fuel flow path;

a lubricant pump for circulating the lubricant in the lubricant flow path;

a lubricant cooler for cooling the lubricant to a temperature suitable for cooling the first circuit to within the first range of temperatures;

a fuel reservoir for storing the combustible fuel;

a fuel pump for circulating the combustible fuel in the combustible fuel path;

a fuel combustor coupled to receive the combustible fuel and compressed air from an air compressor for combusting the combustible fuel in order to produce a combustion product;

a fuel controller for controlling the flow of the combustible fuel to the fuel combustor;

a turbine which is driven by the combustion product produced by the fuel combustor;

a gearbox coupled to the turbine for transferring a driving force from the turbine to at least one output device;

said combustible fuel flow path running consecutively from the fuel reservoir, to a position located adjacent the second circuit, through the fuel controller, and into the fuel combustor, and providing the heat flow path between the combustible fuel and the second circuit when the combustible fuel flows through the combustible fuel flow path; and said lubricant flow path being a closed path running consecutively from the lubricant pump, through the lubricant cooler, to a position located adjacent the first circuit, through the gearbox, and back to the lubricant pump, and providing the heat flow path between the lubricant and the first circuit when the lubricant flows through said lubricant flow path.

9. An auxiliary power unit system according to claim 8, wherein:

the gearbox is coupled to a generator disposed in the lubricant flow path between the gearbox and the lubricant pump which generates and outputs electrical energy for transferring the driving force from the turbine to the generator.

10. An auxiliary power unit system according to claim 8, wherein:

each of said first and second circuit elements contains a plurality of circuit elements.

* * * * *